(12) United States Patent
Blechschmidt

(10) Patent No.: US 9,273,687 B2
(45) Date of Patent: Mar. 1, 2016

(54) METHOD FOR PRODUCING THE TOOTH SHAPE OF THE INNER AND OUTER RING OF AN ANNULAR GEAR MACHINE AND TOOTHED RING PRODUCED BY MEANS OF SAID METHOD

(75) Inventor: Andreas Blechschmidt, Zella-Mehlis (DE)

(73) Assignee: NIDEC GPM GMBH (DE)

( * ) Notice: Subject to any disclaimer, the term of this patent is extended or adjusted under 35 U.S.C. 154(b) by 0 days.

(21) Appl. No.: 14/001,161

(22) PCT Filed: Feb. 21, 2012

(86) PCT No.: PCT/EP2012/052894
§ 371 (c)(1),
(2), (4) Date: Aug. 22, 2013

(87) PCT Pub. No.: WO2012/113768
PCT Pub. Date: Aug. 30, 2012

(65) Prior Publication Data
US 2013/0330222 A1 Dec. 12, 2013

(30) Foreign Application Priority Data
Feb. 22, 2011 (DE) .......................... 10 2011 000 880

(51) Int. Cl.
F03C 2/00 (2006.01)
F03C 4/00 (2006.01)
(Continued)

(52) U.S. Cl.
CPC ................. *F04C 2/084* (2013.01); *F04C 2/086* (2013.01); *F04C 2/102* (2013.01); *F04C 18/084* (2013.01);
(Continued)

(58) Field of Classification Search
CPC .......... F04C 2/084; F04C 2/086; F04C 2/102; F04C 15/0049; F04C 15/0026; F04C 18/084; F04C 2250/00; F01C 1/103; F01C 17/02; F16H 55/08; F16H 55/0806; F16H 57/08; F16H 2055/0893; F16H 2057/0087

USPC .......................... 418/150, 166, 171, 1; 74/462
See application file for complete search history.

(56) References Cited

U.S. PATENT DOCUMENTS 2,666,336 A 1/1954 Hill et al.
2,960,884 A 11/1960 Hill, II
(Continued)

FOREIGN PATENT DOCUMENTS

DE 30 26 222 2/1982
DE 31 34 668 3/1983
(Continued)

OTHER PUBLICATIONS

International Search Report mailed May 30, 2012, issued in connection with corresponding PCT Application No. PCT/EP2012/052894 (3 pages total).
(Continued)

*Primary Examiner* — Theresa Trieu
(74) *Attorney, Agent, or Firm* — Stuart H. Mayer; Mayer & Williams, PC

(57) ABSTRACT

In producing tooth shapes of two toothed rings of an annular gear machine, a starting geometry of a first toothed ring, at least one quality criterion of the annular gear machine, and a desired eccentricity between rotational axes of the two toothed rings are defined. A motion is performed with the starting geometry that performs a rotational motion about its rotational axis and a revolving motion about the rotational axis of the second toothed ring. The rotational and revolving motions are coupled so the rotational angle of the eccentricity equals the product of the rotational angle and tooth count of the first toothed ring. A tooth shape contour of the second toothed ring is generated by recording the path described by the envelope of the starting geometry. If the defined quality criterion is not met, the previously used starting geometry and/or the defined eccentricity is changed and steps are repeated.

11 Claims, 5 Drawing Sheets

(51) Int. Cl.
  *F04C 2/00* (2006.01)
  *F04C 2/08* (2006.01)
  *F04C 18/08* (2006.01)
  *F04C 2/10* (2006.01)
  *F16H 57/08* (2006.01)
  *G06F 17/50* (2006.01)
  *F16H 55/08* (2006.01)
  *F16H 57/00* (2012.01)

(52) U.S. Cl.
  CPC ............... *F16H 55/08* (2013.01); *F16H 57/08* (2013.01); *G06F 17/50* (2013.01); *F16H 2057/0087* (2013.01); *Y10T 29/49242* (2015.01)

(56) References Cited

U.S. PATENT DOCUMENTS

| | | | |
|---|---|---|---|
| 3,709,055 A | 1/1973 | Grove | |
| 4,922,781 A * | 5/1990 | Peiji | 418/171 |
| 5,030,072 A | 7/1991 | Wenker | |
| 2004/0009085 A1* | 1/2004 | Lamparski et al. | 418/171 |
| 2004/0191101 A1* | 9/2004 | Ogata et al. | 418/171 |

FOREIGN PATENT DOCUMENTS

| | | |
|---|---|---|
| DE | 102 08 408 | 9/2003 |
| EP | 0 978 667 | 2/2000 |
| EP | 1 340 913 | 9/2003 |
| EP | 1 462 653 | 9/2004 |
| JP | 10205458 | 8/1998 |

OTHER PUBLICATIONS

Tong, et al. "Design of deviatation-function based gerotors", Mechanism and Machine Theory, 44 pp. 1595-1606 (2009). (12 pages total).

* cited by examiner

METHOD FOR PRODUCING THE TOOTH SHAPE OF THE INNER AND OUTER RING OF AN ANNULAR GEAR MACHINE AND TOOTHED RING PRODUCED BY MEANS OF SAID METHOD

FIELD OF THE INVENTION

The present invention concerns a method for producing the tooth shapes of both the inner ring and the outer ring of an annular gear machine (also known as a gerotor), especially an annular gear pump. Furthermore, the invention concerns an annular gear of an annular gear machine that has such a toothing.

BACKGROUND OF THE INVENTION

Annular gear machines (gerotor machines) possess an inner ring and an outer ring, each of them provided with teeth and tooth gaps regularly distributed about the circumference. The rotational axes of the inner ring and the outer ring are eccentrically set off from each other. The inner ring usually has exactly one tooth less than there are tooth gaps provided at the inner toothing of the outer ring. Annular gear machines today are often used as annular gear pumps, for example, in vehicles as the main pump of the internal combustion engine. The displacement space formed by tooth gaps and housing walls changes with the rotation of the annular gears, so that delivery of hydraulic fluid is accomplished. The delivery volume per revolution is constant in this case. The teeth of the outside-toothed inner ring are usually formed according to various rules for the roll-off behavior of the outer ring. One such known rule is, for example, the movement of the generating contour according to the laws of cycloidal curves rolling on a fixed pitch circle.

The geometries chosen have substantial influence on the delivery behavior, the efficiency, the quiet running and the wear of an annular gear machine. In particular, the design process can configure the tooth shapes, the eccentricity of the rotational axes of the two annular gears, and the remaining play between individual tooth segments without a direct dependency on the external conditions that are dictated by the attached drive unit.

Tooth profiles for annular gears are known from U.S. Pat. No. 3,709,055 that have circular tooth tips and circular tooth base profiles that are joined to each other via straight flanks. There is also a method known from this patent for generating such tooth shapes that can be used, for example in annular gear machines. With the method proposed there, however, it is not possible to achieve a major goal of an annular gear machine, namely, to configure a geometrically closed delivery cell at all times between the two annular gears in the course of the motion, or if so only in very narrow limits. This is especially important to the efficiency of the annular gear pump and the pressures which can be achieved.

U.S. Pat. No. 2,960,884 likewise describes annular gear machines and ways of determining the tooth geometry. The tooth generating method indicated there is mainly suited to accomplishing an evolvent type motion sequence between functionally coupled tooth geometries. The aforementioned main goal of an annular gear machine, namely, uniform tightness of the delivery cell over the entire angle of rotation in the motion sequence, can only be partly accomplished with this method.

JP 10-205458 A indicates a method for determining the tooth geometry of an annular gear pump. Here, the tooth of an outer ring is described by coupled circular arcs, after which the toothing of the inner ring can be generated. The definition of special geometries of toothing schemes with undercuts or to reduce the Hertzian pressure is hardly possible, if at all, due to being limited to describing the tooth shape by means of a defined number of circular arcs.

From EP 1 340 913 B1 and DE 102 08 408 A1 there is known a gear machine that has uses as an annular gear pump. The primary goal here is to optimize the geometry of the gears in order to lessen the noise during operation of the pump. The tooth tips and tooth roots used have a geometry that is described by curves of second or higher order, while the tooth roots or the flanks of the tooth roots are formed by circular arcs. To determine the profile contours of the toothing it is proposed to specify the inner toothing of the outer rotor as the master toothing. The tooth root profile contour of the inner rotor is derived kinematically from the tooth tip profile contour of the inner toothing by the law of gear meshing, while the tooth tip profile contour is obtained from the generating cuts of the tooth root profile contour of the inner toothing. The bearing points of the polygons representing the tooth roots of the outer toothing are determined by the law of gear meshing, while the bearing points of the spline functions representing the tooth tips of the outer toothing are found by a generating cut method. However, studies have shown that the tooth shapes which can be generated in this way lead to limitations in regard to efficiency and flow conditions in the annular gear machine. Another drawback is the rigid definition of the root fillet, which has limiting effect on the configuration of a dirt catching space, for example.

U.S. Pat. No. 5,030,072 reveals a method for the design of the tooth shape of an annular gear machine, wherein at first a radial cam distance is determined and then a cam radius is varied by iteration until a single-point distance and a double-point distance equal the determined cam distance.

DE 30 26 222 A1 shows an annular gear pump in which the theoretical tooth shape of the pinion is determined by rolling off the pinion pitch circle on the hollow wheel pitch circle. One starts with a particular shape of toothing for the design of the tooth shape of the pinion. The method is only applicable to this particular tooth shape.

U.S. Pat. No. 2,666,336 shows a method for the design of toothings for rotoids which have different tooth relations, unlike gerotors (annular gear machines). The starting point is an outer circle with diameter A and a pinion circle with diameter B, from which one gets the eccentricity E.

In the article "Design of deviatation-function based gerotors", Shih-Hsi Tong et al., Mechanism and Machine Theory 44 (2009) 1595-1606, a novel method is discussed for the generating of gerotor profiles. This method is based on the use of variance functions, but it requires time-consuming calculations and design steps and can lead to dimensioning problems, especially when undercuts are present.

One problem of the present invention is, starting from the prior art, to indicate a method for the generating of the tooth shapes of inner and outer ring of an annular gear machine, especially an annular gear pump, which is easy to implement, requires no extensive knowledge of mathematical relations, and affords the designer a broad dimensioning freedom to satisfy different demands on the annular gear machine being created. The goal is to dispense with the heretofore customary description of the tooth contours by cycloids, ellipses, evolvents, circular arcs, or similar mathematically easily described curve segments, since these limit the possible geometries of the tooth shapes. At the same time, the tooth shapes generated should be described with sufficient accuracy by the currently available technical aids, especially CAD and CAM systems, so as to enable an automated manufacturing of corresponding inner and outer rings with available machine tools.

The above problem is solved by a method according to the enclosed claim 1.

SUMMARY OF THE INVENTION

The invention is based on the fundamental knowledge that the tooth shapes of inner and outer ring can be generated by the description or execution of a relative motion between the two rings if a few easily defined parameters or starting conditions are obeyed. Therefore, to generate the tooth shape, a relative motion between inner and outer ring is executed or mathematically modeled, making use of the angle relation of this relative motion and a predetermined eccentricity between the rotational axes of the rings and a previously defined pitch circle on one of the two rings, such as the outer ring.

Essentially, the method can be carried out by beginning with the starting geometry of the inner or outer ring. Unless otherwise stipulated hereafter, the remarks pertain to an example in which the outer ring is treated as a first annular gear whose starting geometry is being chosen. The number of teeth of the outer ring should also necessarily be established as part of the starting geometry. This necessary stipulation is influenced by the choice of the eccentricity and the design size of the pump (pitch circle). The number of teeth of the outer ring can also be determined from the desired number of teeth of the inner ring (number of teeth of the inner ring+1). Another part of the starting geometry is the pitch circle radius (e.g., that of the outer ring), which is usually taken to be the mean value between the radius at the tooth tip and that at the tooth root (pitch circle=distance from tooth center to tooth center on the rolling circle). The executing of the motion generating the tooth shape contour is preferably computer-assisted and done on a CAD model. The preliminary generating geometry is rotated step by step as an envelope curve, maintaining the following explained condition of motion for generating and evaluating the mating tooth (on the second annular gear).

Furthermore, it is critical to the present invention that the repeated iteration of the aforementioned motion sequence with starting conditions varied each time can achieve a stepwise optimization of the tooth shapes. This is done, for example, in the context of an iteration process to fulfill one or more predetermined quality criteria by the particular tooth shape generated or to come as close as possible to these quality criteria. The quality criteria can be any conceivable requirements on the annular gear machine being created, such as the efficiency, the delivery volume, the maximum pressure achieved, a minimum remaining gap between inner ring and outer ring, or even a specified configuration in certain segments of the tooth geometry so that, for example, the noise behavior of the annular gear machine can be substantially influenced.

To carry out the method of the invention, in a first step a starting geometry is determined, e.g., for the outer ring, fully describing the latter. Besides the tooth width and the number of teeth, this also includes a preliminary pitch circle and the pitch circle radius on the outer ring. In the case when the method is implemented by software, this specification is done by using the functions available in customary CAD programs. When specifying the starting geometry, the person skilled in the art can start from annular gear shapes that are known from the prior art or is free to choose an annular gear shape within broad limits, from which he expects to achieve one or more specially desirable parameter (quality criteria) of the annular gear machine being dimensioned. The starting geometry need only ensure that an annular gear machine can basically be constructed with it.

Furthermore, it is necessary to optimizing the annular gear shapes that at least one quality criterion be defined for the annular gear machine whose fulfillment constitutes a goal in the configuring of the annular gears or the tooth shapes to be used for them. One possible quality criterion, though not necessary in every case, would be constant play of the tooth tip across the angle of rotation, for example. It is of paramount importance to consider the behavior of the tip play in the region of maximum approach of the tip circle on the inner ring and the root circle on the outer ring.

It should be pointed out that the specification of the starting geometry can be done either by generating a geometry adapted to the desired toothing to be achieved, one which encompasses both the tooth tip and the tooth root region, or preferably by mathematical description of a complete inner or outer ring. It is enough in specifying the starting geometry to completely describe at least half a tooth period of the inner or outer toothing. The particular toothing on the inner or outer ring is recurrent along the circumference of the ring, and a tooth period can consist each time of one tooth and one tooth gap. Both tooth and gap are symmetrical in themselves, so that the complete geometry of the annular gear is described by specifying a curve within a half tooth period. By mirror imaging of this curve, the tooth period can be made complete and then be executed repeatedly on the circumference of the annular gear.

The starting geometry being specified also includes the necessary data for determining the radius of the annular gear, the geometrical relations of which are sufficiently well known to the person skilled in the art and therefore need not be described in detail.

Once the aforementioned starting values have been determined, a movement according to the following fundamental motion condition is performed with the starting geometry of the first ring: the first annular gear (e.g., outer ring) or a segment of an envelope curve describing the starting geometry performs a rotational movement about its own (first) rotational axis; and at the same time, a revolving movement about the rotational axis of the not yet defined second annular gear (inner ring), whose position to the first rotational axis is determined by the previously established eccentricity (distance between the two rotational axes A, B). During this dual movement, the following angle relation is to be obeyed continuously:

$$b = a \times Z$$

where
a=angle of rotation of the first annular gear (outer ring)
b=angle of rotation of the eccentricity
Z=number of teeth on the first annular gear (outer ring)

For example, if the starting geometry has been specified for the inner toothing of the outer ring, a rotational movement of the outer ring is performed about a certain angle of rotation relative to the inner ring, whose tooth geometry is not known at first. For easier understanding, note that in the simplest case a complete revolving movement of the outer ring about the inner ring is performed, during which the trajectory completed by the starting geometry is plotted. The path trajectory of the envelope curve segments of the starting geometry constitutes the opposing tooth shape of the outer toothing of the inner ring. The envelope curve of the starting geometry constitutes the sum of all envelope curve segments in the given minimal range of movement.

Upon closer scrutiny, however, the revolving motion need not be performed about a complete rotation, since it is likewise sufficient when determining the resultant tooth shape contour of the second toothing (here, the inner ring) for at least one half-period of the tooth and tooth gap sequence to be described. Therefore, the revolving movement of the first annular gear must be performed at least about one angle of rotation b, corresponding to one half-tooth period of the second annular gear mating with the first annular gear. This angle of rotation b, when the described rule of formation is obeyed, automatically generates the number of teeth of the inner ring, which is essentially one less than the number of teeth of the outer ring, so that it is easy to determine the minimal angle of rotation to be used.

After performing the explained double movement, the initially specified starting geometry of the first annular gear and a first generated and thus plotted tooth shape contour and thus a fundamentally possible geometry of the second annular gear are obtained. As a rule, the likewise specified quality criterion is not yet achieved after the first step. According to the invention, therefore, the starting geometry of the first annular gear is varied in at least one parameter in an (initially arbitrary) direction. Preferably, boundary conditions can be set for the variation and/or relations for meaningful changes are established. For example, the width of the tooth of the first annular gear can be varied by 10% in order to adapt the starting geometry for the next step in the method. Alternatively or cumulatively with the changing of the starting geometry of the first annular gear, the eccentricity between the rotational axes of the two annular gears can be altered, which likewise has effects on the resulting tooth shape contour. Advantageously, however, a fixed value of the eccentricity will be assumed here. The desired target value will be a functionally optimized tooth shape, at the same time having a minimal pitch circle and optionally a maximum number of teeth.

In the next step of the method, based on the changed starting conditions the double movement of the first annular gear about the second annular gear and about its own axis of rotation is again performed, while obeying the condition of movement or angle as described above. This produces a second tooth shape contour, differing from the first tooth shape contour obtained by the previous steps, so that a testing can then be performed to see which of the two tooth shape contours better meets the defined quality criterion. Finally, the mentioned steps can be repeated in an iteration to bring the tooth shape contours closer to a desired optimum in terms of the quality criterion.

As a result of the above described generating and optimizing of tooth shapes on the inner and outer ring of an annular gear machine, as a rule one will have tooth shape contours or geometries that can be represented simply by splines of higher order (such as third order). Although in the simplest case a tooth shape can also be generated approximately with the described method, the same as can be done with traditional methods, unlike the prior art it is now possible to also create tooth shapes that are easily optimized for different applications, even though they can no longer be represented with traditional methods. By using the mentioned splines the contours can furthermore be described mathematically so that they can be used in available data processing programs, in particular for further optimization and for control of machine tools.

One benefit of the method according to the invention thus consists in that, unlike the classical use of rolling curves (cycloids) to describe the tooth shapes that roll along the pitch circle of the toothing to generate the cycloids and form one side of a toothing contour, no mandatory coupling with the pitch circle as the shape generating condition is assumed here.

Since, with the method of the invention, the complete tooth shape contour of the inner and the outer ring is generated in each run-through, starting from a given starting geometry of a first annular gear, the resulting tooth shape contours or geometries on the one hand and the roll-off or sliding behavior of the toothing of the two annular gears on the other hand can undergo an evaluation, i.e., a comparison with a quality criterion. If the quality criteria are properly chosen, one can also generate gerotor toothings with relatively large eccentricity values in this way. Obeying the above explained condition of motion assures a harmonic movement sequence between inner and outer toothing, as well as a kinematically harmonic running with high efficiency.

Especially when the annular gear machine is used as an annular gear pump, the method of the invention enables a dimensioning with large eccentricities, so that streamlined delivery chambers can be configured to improve the delivery performance at high operating speed. The method is basically suitable for the most diverse tooth shapes, numbers of teeth, eccentricities and pitch circle radii. Furthermore, it is advantageous that no special steps need to be taken to adapt the ends of individual curve segments which are customarily used for the description of the tooth shape to mathematical requirements of the description being used in their transitional behavior. Instead, the curves result entirely from the explained process of optimizing the tooth shape. The mathematical description of the resulting geometry is done preferably by splines of higher order, and sufficient accuracy for practical requirements can usually be attained already with splines of third order.

According to one preferred embodiment, several quality criteria can be established, which are checked in parallel for their fulfillment when evaluating several generated tooth shape contours. For example, besides a minimum volume being delivered, one can also specify the force relations to be obeyed between the tooth flanks of the meshing teeth. In this way, it is possible to reduce the Hertzian pressure, for example, by increasing the local contact radii (arcs).

Furthermore, it is advantageous already when establishing the starting geometry of a first annular gear to describe the tooth contour not with circular arcs, ellipses or segments of angle functions and evolvents, as in the prior art, but instead to determine the starting geometry by a variable spline, preferably of third order. Such splines can be described and varied specifically by the above-described optimization loops with customary software (e.g., Inventor, Catia, Pro-E and UG).

Further benefits, embodiments and details will emerge from the following description of a preferred procedure for implementing the method of the invention, making reference to the drawing.

DETAILED DESCRIPTION

Figure 1:
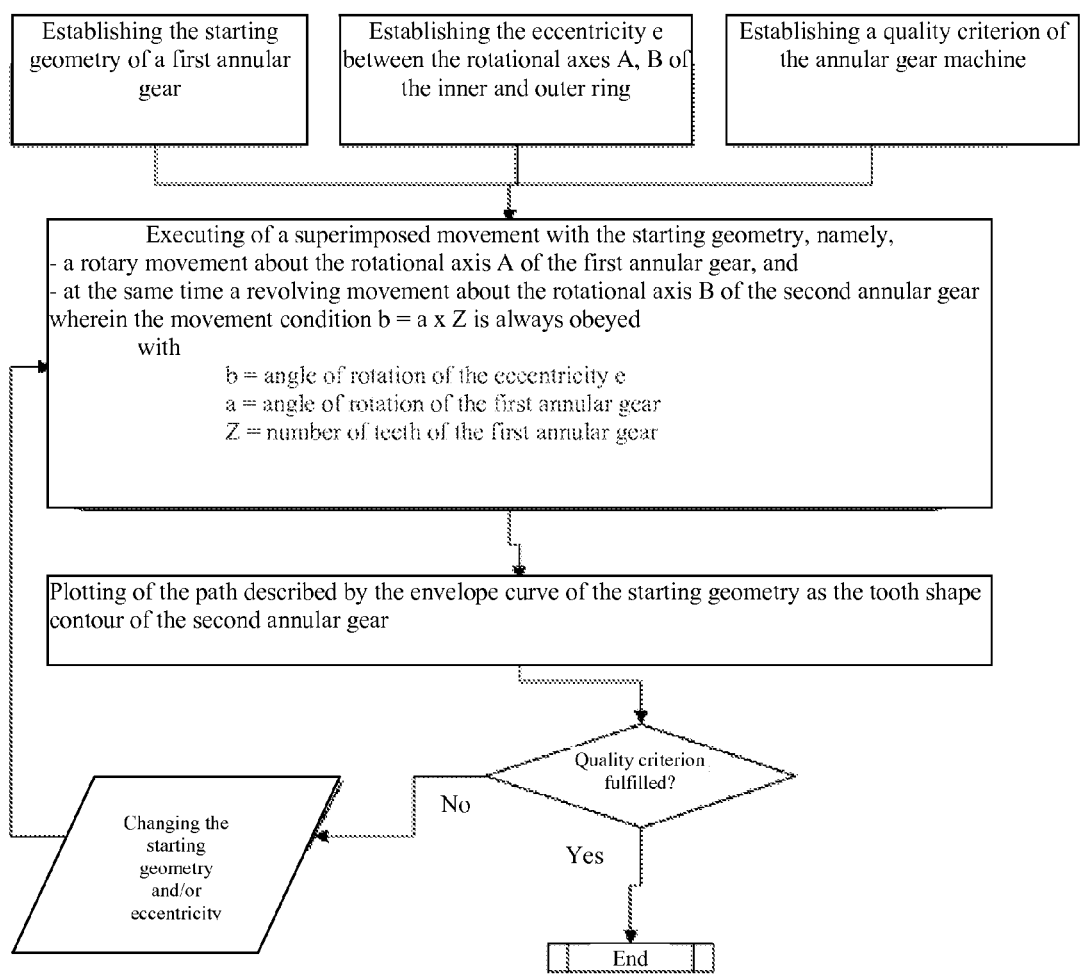
FIG. 1 shows a flow chart of essential steps in implementing the method of the invention according to a first embodiment.
Figure 2:
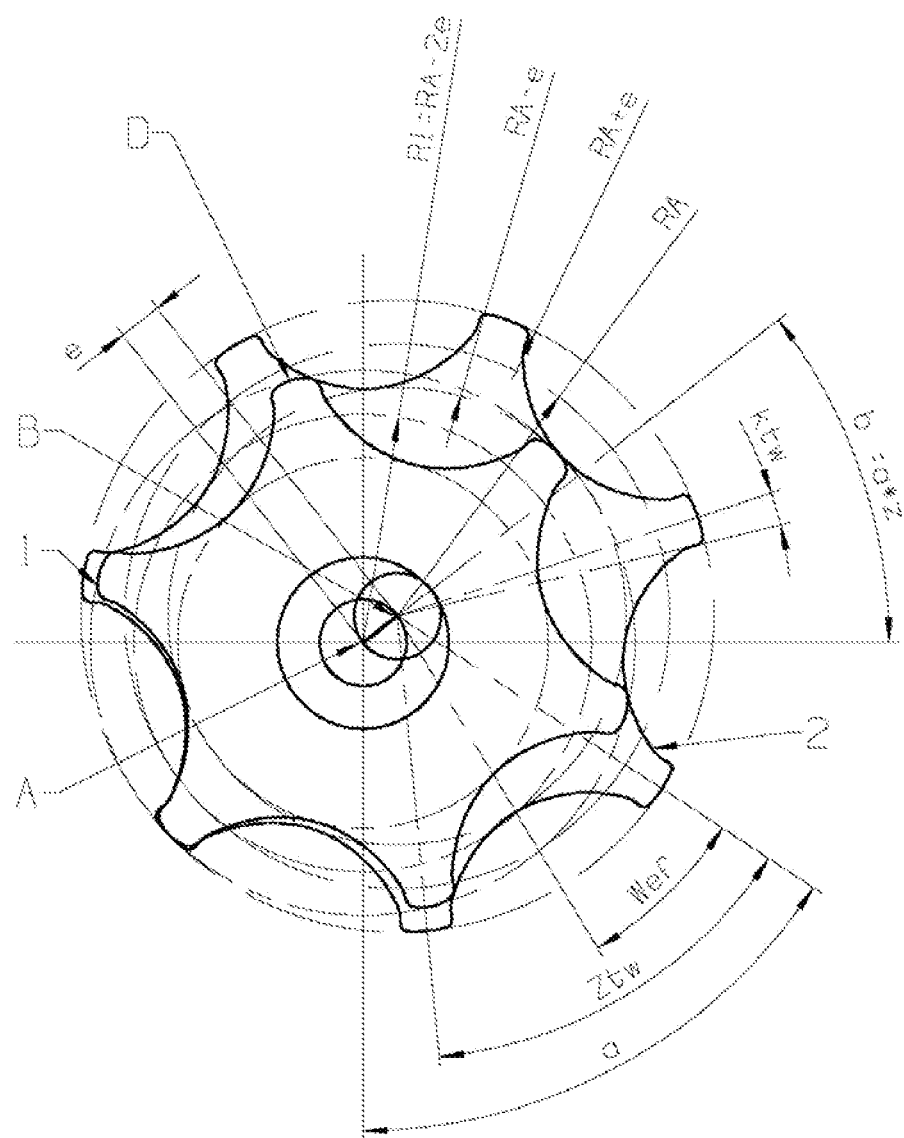
FIG. 2 shows a schematic representation of an annular gear machine with an outside toothed inner ring and an inside toothed outer ring as well as designated geometrical parameters.
Figure 3:
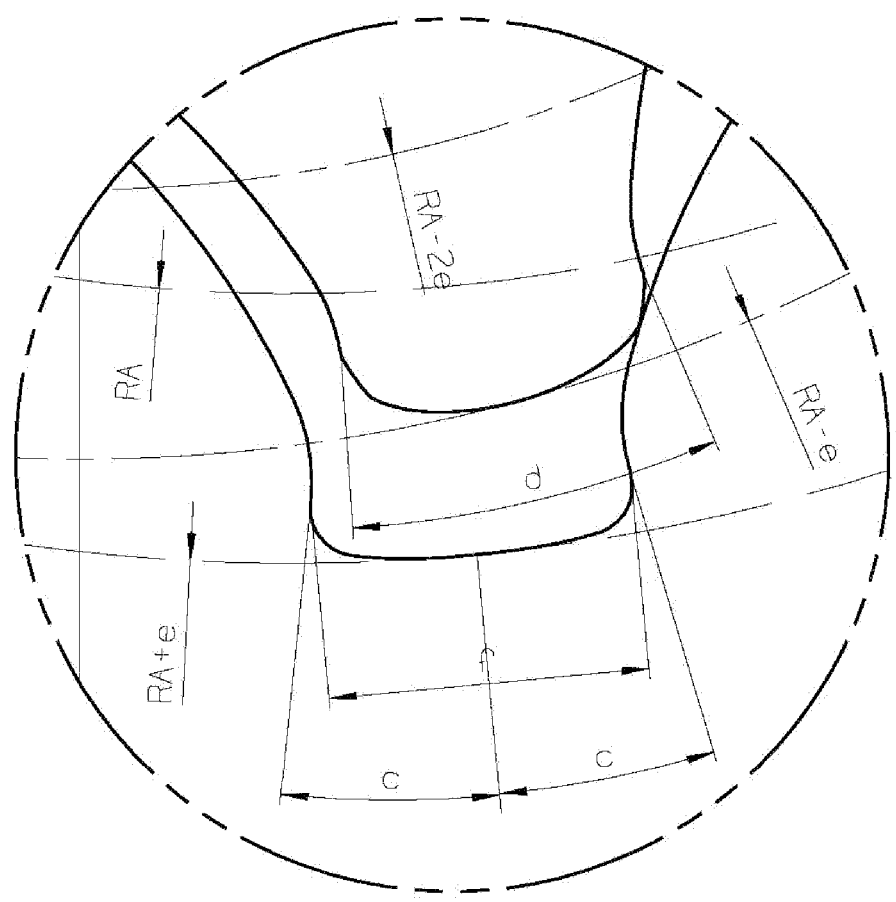
FIG. 3 shows a detailed representation of a tooth of the inner ring during a motion sequence through a tooth gap of the outer ring.

The following description of essential and preferred steps of the method of the invention makes reference to FIG. 1, in which the sequence of the method is summarized, and at the same time referring to FIGS. 2 and 3, in which important geometrical features of the teeth of an annular gear machine are shown.

Basically, the method of the invention is aimed at generating tooth shapes of an annular gear machine, wherein the annular gear machine has an inner ring 1 with an outer toothing and an outer ring 2 with an inner toothing as principal elements. In a typical application, the inner ring can be mounted on a power take-off shaft of a drive assembly, while the outer ring 2 is mounted and able to turn in a housing (not shown). In operation, the inner ring 1 rotates about a first rotational axis A, while the outer ring 2 can turn about a second rotational axis B. The rotational axes A, B are set off from each other or spaced apart by the amount of an eccentricity e. Furthermore, during the operation of the annular gear machine the outer ring 2 moves in a revolving motion about the first rotational axis A, i.e., the eccentricity e rotates about the point of rotation through which the first rotational axis A passes.

In FIG. 3 one sees the typical tooth shape contour of a single tooth of the inner ring 1 as well as a complementary tooth gap of the outer ring 2 in magnified detail view. The geometrical conditions needed for the definition of the starting geometry are also indicated here. In FIG. 3 the maximum elevation of the tooth is indicated at $R_A+e$ and the minimum depth of the tooth gap at $R_A-e$. Finally, the maximum tooth tip width and an optionally tapered tooth tip width in the case of teeth with a neck can also be important in establishing the starting geometry. The individual geometrical features of the tooth shape contour shall be further discussed below.

The pitch circle of the inner ring is generated automatically by the functional relations deriving from the pitch circle of the outer ring (or vice versa, if the inner ring and not the outer ring is defined by the established starting geometry) by the following laws:

$$Ri=R_A-2e$$

where
$R_A$=pitch circle of the outer ring
$Ri$=pitch circle of the inner ring
$e$=eccentricity between the rotational axes Furthermore, the following relations are important in describing the starting geometry:

$$Z_{tw}=360°/Z$$

where
$Z_{tw}$=pitch angle on the outer ring $$K_{tw}=Z_{tw} \cdot g$$

where
$K_{tw}$=tooth root angular pitch on the outer ring
$g$=tooth pitch/root width ratio, preferably 0.08 to 0.13

$$W_{ef}=0.5Z_{tw}$$

where
$W_{ef}$=generating flank angle $$E_{fv}=W_{ef}/K_{tw}=h$$

where
$E_{fv}$=generating flank angle ratio
$h$=tip width/root width ratio, preferably 3 to 5.5

In the example shown in FIG. 3, a club-shaped tooth is generated on the inner ring. The club shape can be defined by the lobe angle d. A flattened geometrical region on the tooth of the inner ring constitutes the result of a tooth geometry optimization. This region serves to partially reduce the Hertzian pressure in the contact region with the toothing on the outer ring. According to experience, this region is heavily loaded when torque is applied and can lead to possible wear when the Hertzian pressure is too high.

Figure 4:
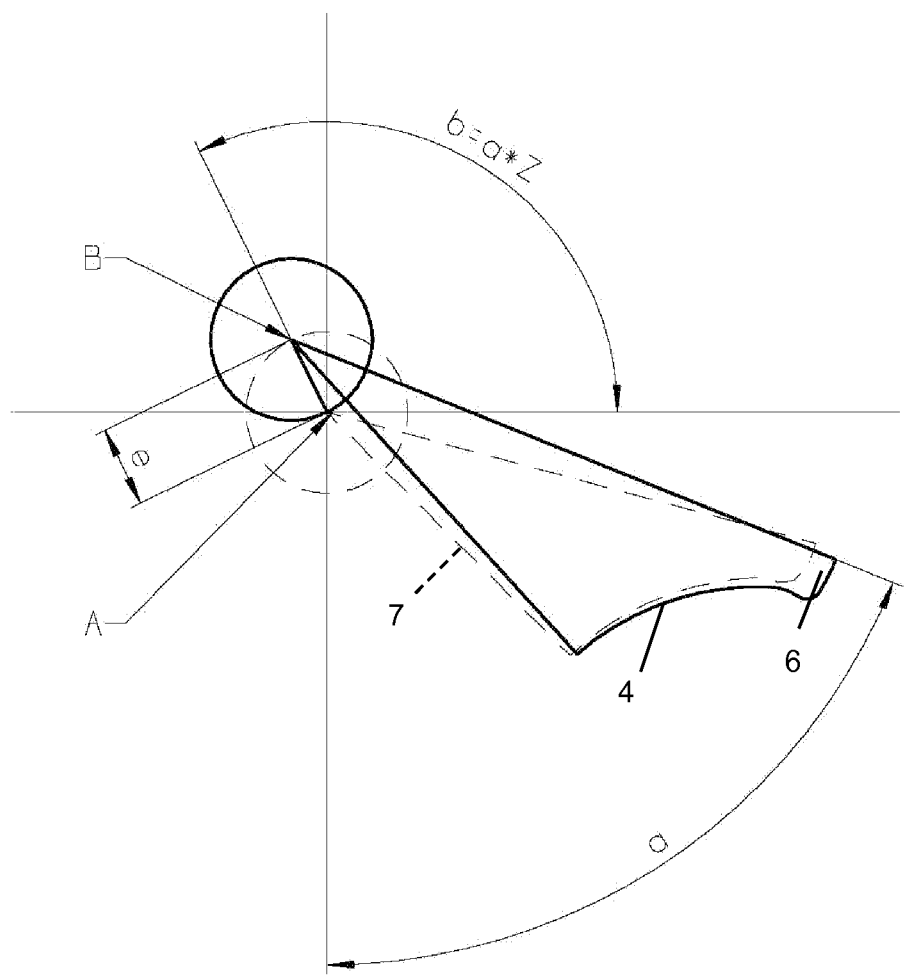
FIG. 4 shows a schematic representation of the motion sequence to generate the tooth shape contour at a first moment of time at the beginning of the movement
Figure 5:
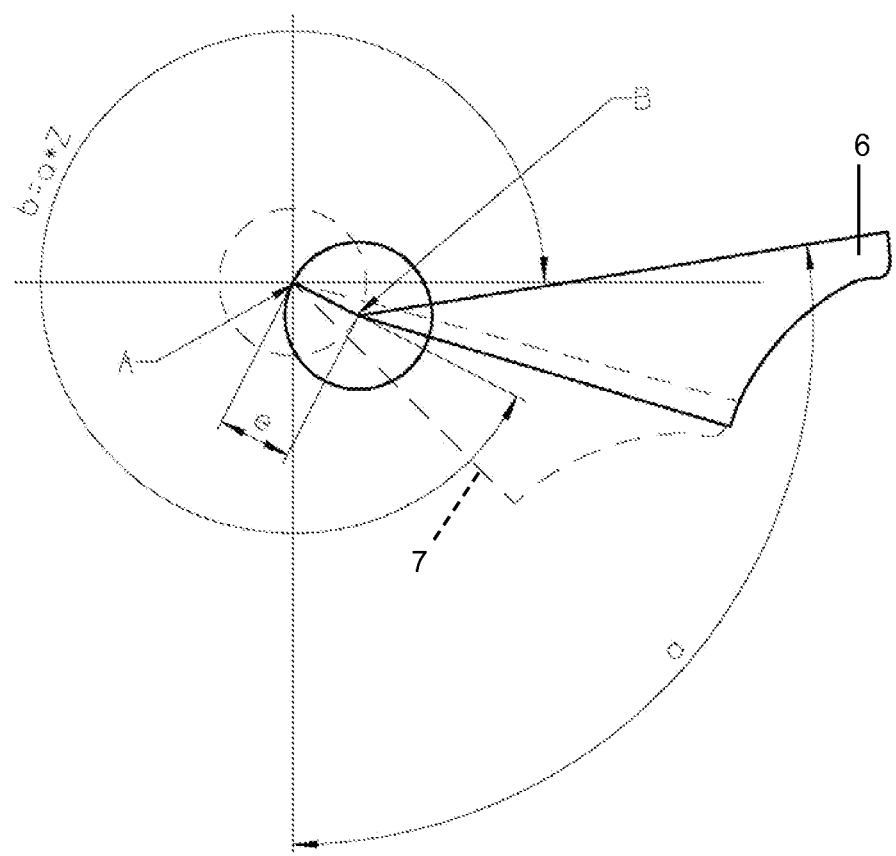
FIG. 5 shows a schematic representation of the motion sequence to generate the tooth shape contour at a second moment of time at the end of the movement.

FIGS. 4 and 5 show two segments in the generating of a tooth shape, as examples. To carry out the method of the invention, in the first step a starting geometry is established for a first annular gear. The first annular gear can be the inner or the outer ring. The starting geometry can be defined entirely by describing one half-tooth period. For example, FIG. 4 shows a segment of the outer ring 2 consisting of a half tooth and a half tooth gap as the outer ring contour 6 (solid line). Preferably, this segment of the starting geometry is defined by a spline 4 of third order with, say, eight bearing points. The spline 4 describing the starting geometry is enclosed by two radially extending angle lines (or pitch boundary lines), which are spaced apart by a half-tooth period. The angle $W_{ef}$ (FIG. 2) subtended between the angle lines is called the generating flank angle. The spline 4 extends at both ends perpendicular to the angle lines. In the radial direction, the spline 4 is bounded by the relation between the pitch circle of the outer ring $R_A$ and the eccentricity e (FIG. 3). On the mating inner ring, the motion should generate an inner ring contour 7, whose configuration not yet created is shown by broken line.

Besides the starting geometry, it is also necessary to establish at the outset of the method the eccentricity e between the rotational axis A of the inner ring 1 and the rotational axis B of the outer ring 2, as well as at least one quality criterion as boundary condition to be met by the annular gear machine being created.

As already discussed in general above, in the next step of the method a rotary movement of the predefined starting geometry 6 of the outer ring 2 about its own rotational axis B and at the same time a revolving movement about the rotational axis A of the inner ring 1 being formed is carried out. During this double motion, according to the invention the following general condition of movement must be obeyed:

$$b=a \times Z$$

where, in the example described here:
$a$=angle of rotation of the outer ring
$b$=angle of rotation of the eccentricity
$Z$=number of teeth on the outer ring For the complete description of the tooth contour on the second annular gear it is basically enough to carry out the relative rotary movement for at least one half-tooth period of the second annular gear, so that the previously established starting geometry, i.e., the envelope curve that describes at least one half-tooth period on the predefined first annular gear, is moved along a trajectory that describes the tooth contour of the mating second annular gear.

FIG. 5 shows the situation at a later time after performing the double movement. The eccentricity e and with it the outer ring contour 6 here have swiveled further by an angle of rotation b=707° about the rotational axis A as compared to the position shown in FIG. 4. During this process, the angle of rotation a has changed from 68° (for b=476°) to 101°. Thus, given a number of teeth for the outer ring of Z=7, the mentioned condition of motion has been obeyed. The inner ring contour 7 is almost completely described in the state shown in FIG. 5, i.e., the generating motion is almost finished.

After the tooth shape contour of the second annular gear has been generated and plotted by performing the double movement, a first check can be made as to whether the present tooth shape contours of the two annular gears already satisfy the previously established quality criteria or whether the tooth shapes need to be adapted. If the quality criterion is still not fulfilled, which will usually be the case after the first runthrough, the starting geometry and/or the initially established eccentricity is changed by a predetermined value, preferably in a given direction where an improvement of the geometry is expected. This change of values can be done automatically under predetermined boundary conditions or be specified manually by the user, who may be asked to enter data at this point. The user can use his experience in dimensioning such systems to influence the change in the starting geometry, although this is not necessary for the automatic running of the method. With the altered starting values, the rotary movement is then performed again to plot a second tooth shape contour of the second annular gear. This iteration loop can be executed several times, preferably while performing iterative steps. Once the quality criteria are fulfilled, the method can be ended and the last established or plotted tooth shape contours of the two annular gears thus constitute the result of the generating process.

By using the above-mentioned movement condition, a very simple simulation of the movement process and thus a simple generating method for the tooth geometries is assured as compared to the equations of motion used in the prior art. In every instance, a closed envelope curve is generated to describe the tooth shape on the second annular gear, representing the contour of the tooth geometry of the teeth being arranged there while constrained to obey the movement condition on the outer ring. By including the pitch circle diameter $R_A$ of the outer ring in the possible variables that can be changed during several iterations of the method, and the computer-aided simulation/modeling of the movement condition of the outer ring contour, it is possible to find an optimal geometry for the inner ring tooth contour in a few steps of iteration and this can afterwards be represented by splines.

LIST OF REFERENCE NUMBERS

1—Inner ring
2—Outer ring
3—
4—Spline
5—
6—Outer ring contour
7—Inner ring contour
A—Rotational axis of the inner ring
B—Rotational axis of the outer ring
e—Eccentricity
$W_{ef}$—Generating flank angle
a—Angle of rotation of the first annular gear (outer ring)
b—Angle of rotation of the eccentricity e
Z—Number of teeth at the first annular gear (outer ring)
$R_A$—Pitch circle outer ring
$R_i$—Pitch circle of the inner ring
$Z_{tw}$—Pitch angle at the outer ring
$E_{fv}$—Generating flank angle ratio
$K_{tw}$—Tooth root angular pitch at the outer ring
g—Tooth pitch/root width ratio
h—Tip width/root width ratio
d—Lobe angle

The invention claimed is:

1. A method for forming tooth shape of a first and a second annular gear of an annular gear machine, comprising the following steps:
   a) establishing a starting geometry of the first annular gear, the annular gear machine, at least one quality criterion of the annular gear machine as well as a desired eccentricity (e) between rotational axes (A, B) of the two annular gears, wherein the starting geometry is described by splines of higher order;
   b) performing a movement with the starting geometry established, wherein the starting geometry performs a rotational movement about the rotational axis (B) of the first annular gear and at the same time a revolving movement about rotational axis (A) of the second annular gear, and wherein this rotational movement and this revolving movement are interrelated such that an angle of rotation (b) of the eccentricity (e) is continuously equal to a product of an angle of rotation (a) of the first annular gear and a number of teeth (Z) of the first annular gear (b=a×Z);
   c) generating a tooth shape contour of the second annular gear by plotting the path described by an envelope curve of the starting geometry when performing the movement according to step b), wherein the plotted tooth shape contour is described by splines of higher order;
   d) checking for the quality criterion to be fulfilled with the starting geometry and the plotted tooth shape contour;
   e) if the quality criterion is not yet fulfilled, varying the previously used starting geometry or the established eccentricity;
   f) iterative repeating of steps b) to e) and generating a different tooth shape contour until the quality criterion is fulfilled;
   wherein the first annular gear is the outer ring of the annular gear machine.

2. The method according to claim 1, wherein at least one half-tooth period is specified as the starting geometry.

3. The method according to claim 2, wherein the iterative repetition of steps b) to e) is broken off regardless of fulfilling the quality criterion when a previously determined termination criterion is fulfilled.

4. An annular gear of an annular gear machine, wherein at least the tooth shape of its toothing has been produced by a method according to claim 2.

5. The method according to claim 1, wherein the iterative repetition of steps b) to e) is broken off regardless of fulfilling the quality criterion when a previously determined termination criterion is fulfilled.

6. An annular gear of an annular gear machine, wherein at least the tooth shape of its toothing has been produced by a method according to claim 5.

7. The method according to claim 1, wherein the revolving movement in step b) is executed by an angle of rotation (b) of the eccentricity (e) that spans at least one half-tooth period of the second annular gear.

8. An annular gear of an annular gear machine, wherein at least the tooth shape of its toothing has been produced by a method according to claim 7.

9. An annular gear of an annular gear machine, wherein at least the tooth shape of its toothing has been produced by a method according to claim 1.

10. The method according to claim 1, wherein the iterative repetition of steps b) to e) is broken off regardless of fulfilling the quality criterion when a previously determined termination criterion is fulfilled.

11. The method according to claim 1, wherein the iterative repetition of steps b) to e) is broken off regardless of fulfilling the quality criterion when a previously determined termination criterion is fulfilled.

* * * * *